US007719272B2

(12) United States Patent
Yamashita

(10) Patent No.: US 7,719,272 B2
(45) Date of Patent: May 18, 2010

(54) MAGNETIC RESONANCE IMAGING APPARATUS

(75) Inventor: Masatoshi Yamashita, Otawara (JP)

(73) Assignees: Kabushiki Kaisha Toshiba, Tokyo (JP); Toshiba Medical Systems Corporation, Otawara-Shi (JP)

( * ) Notice: Subject to any disclaimer, the term of this patent is extended or adjusted under 35 U.S.C. 154(b) by 0 days.

(21) Appl. No.: 12/122,170

(22) Filed: May 16, 2008

(65) Prior Publication Data

US 2008/0284438 A1 Nov. 20, 2008

(30) Foreign Application Priority Data

May 18, 2007 (JP) ............... 2007-132471
Apr. 11, 2008 (JP) ............... 2008-103582

(51) Int. Cl.
*G01V 3/00* (2006.01)
(52) U.S. Cl. .................................. 324/307
(58) Field of Classification Search .......... 324/300–322
See application file for complete search history.

(56) References Cited

U.S. PATENT DOCUMENTS 5,323,776 A * 6/1994 Blakeley et al. ............. 600/324
5,532,597 A * 7/1996 McGinley et al. ........... 324/319
5,592,087 A * 1/1997 Richard et al. .............. 324/318
6,492,816 B1 * 12/2002 Feenan ....................... 324/318
6,538,440 B2   3/2003 Dean et al.
6,954,068 B1 * 10/2005 Takamori et al. ............ 324/318

FOREIGN PATENT DOCUMENTS

JP    2001-198102    7/2001

* cited by examiner

*Primary Examiner*—Brij B Shrivastav
*Assistant Examiner*—Dixomara Vargas
(74) *Attorney, Agent, or Firm*—Oblon, Spivak, McClelland, Maier & Neustadt, L.L.P.

(57) ABSTRACT

A magnetic resonance imaging apparatus includes a bed, a static field magnet, a gradient coil, a liner and a heat transfer material. The bed includes a table-top capable of placing thereon an object. The static field magnet generates a static magnetic field. The gradient coil, formed inside the static field magnet, generates gradient magnetic fields. The liner, provided inside the gradient coil, forms a bore in which the table-top is advanced or retreated. Further, the heat transfer material is attached to the liner.

13 Claims, 5 Drawing Sheets

MAGNETIC RESONANCE IMAGING APPARATUS

BACKGROUND OF THE INVENTION

1. Field of the Invention

The present invention relates to an MRI (magnetic resonance imaging) apparatus which generates a uniform static magnetic field and gradient magnetic fields.

2. Description of the Related Art

A medical imaging apparatus provides a large amount of information on a patient in the form of an image, and plays an important role in many medical practices including a diagnosis of a disease, a treatment, and an operation planning. Currently, major medical imaging apparatuses include an ultrasonic diagnostic apparatus, an X-ray computerized tomography (CT) apparatus, an MRI apparatus, and a nuclear medicine diagnostic apparatus. In particular, the MRI apparatus can collect a high-quality contrast image of a soft tissue, and occupies an important place in the medical diagnostic imaging.

The MRI apparatus includes a cylindrically shaped static field magnet having an axis extending in an advance and retreat direction of a table-top, a cylindrically shaped shim coil having an axis extending in the advance and retreat direction of the table-top and provided inside the static field magnet, a cylindrically shaped gradient coil having an axis extending in the advance and retreat direction of the table-top and provided inside the shim coil, and a cylindrical liner having an axis extending in the advance and retreat direction of the table-top and provided inside the gradient coil to form a bore in which the table-top is advanced or retreated (see Japanese Patent Application Publication No. 2001-198102, for example). In an imaging process, the MRI apparatus generates a static magnetic field in a bore formed by the liner, and causes the gradient coil to form gradient magnetic fields in an X-axis direction, a Y-axis direction, and a Z-axis direction in a field of view for imaging a patient set inside the bore. Further, the MRI apparatus transmits a high-frequency signal from a radio frequency (RF) coil provided to thereto to magnetically resonate the nuclear spin in the patient and reconstruct an image of the patient with the use of a nuclear magnetic resonance (NMR) signal generated by the excitation.

The MRI apparatus normally requires a static magnetic field strength of approximately a few kilogauss to approximately ten kilogauss (one tesla). Further, the MRI apparatus is required to have a high spatial uniformity, i.e., a spatial uniformity of dozens of ppm or less. The spatial area required by the MRI apparatus frequently has a spherical size of 50 [cm] in diameter.

Along with an increase in the speed of the imaging technique, high-speed switching and increased strength of the gradient magnetic fields are indispensable in the MRI apparatuses of recent years.

Due to the indispensability of the high-speed switching and the increased strength of the gradient magnetic fields in the MRI apparatuses of recent years, the gradient coil is applied with a high current, and thus the amount of the heat generated by the gradient coil tends to increase. However, the generated heat cannot be sufficiently suppressed solely by a gradient coil cooling system present in the conventional technique. Due to the heat conduction and radiation, therefore, the heat generated by the gradient coil is conducted to an outer circumferential surface of the liner provided inside the gradient coil. Accordingly, an inner circumferential surface of the liner is also locally increased in temperature.

According to the conventional technique, an examination room housing the MRI apparatus is fully air-conditioned, and the bore formed by the liner includes therein a device having an air blowing function or the like. Such a device, however, cannot handle the local increase in temperature of the inner circumferential surface of the liner due to the heat generated by the gradient coil. In some cases, the heat generated by the gradient coil locally increases the temperature of the inner circumferential surface of the liner in contact with the patient up to approximately 50° C. As a result, the patient may feel discomfort from his contact with the liner. The contact of the patient with the liner even poses a risk of causing a low-temperature burn to the patient.

Further, in recent years, there has been a possibility of a reduction in thickness of the liner along with a tendency to enlarge the bore. In such a case, the heat of the outer circumferential surface of the liner is easily conducted to the inner circumferential surface of the liner. Consequently, the discomfort to the patient is increased, and the risk of the low-temperature burn is also increased.

SUMMARY OF THE INVENTION

The present invention has taken into consideration the above-described problems, and it is an object of the present invention to provide an MRI apparatus of the present invention which can provide an optimal imaging environment for the patient.

To solve the above-described problems, the present invention provides the MRI apparatus comprising: a bed including a table-top capable of placing thereon an object; a static field magnet configured to generate a static magnetic field; a gradient coil, formed inside the static field magnet, configured to generate gradient magnetic fields; a liner, provided inside the gradient coil, configured to form a bore in which the table-top is advanced or retreated; and a heat transfer material attached to the liner.

DESCRIPTION OF THE PREFERRED EMBODIMENT

An embodiment of a magnetic resonance imaging apparatus according to the present invention will be described with reference to the accompanying drawings.

Figure 1:
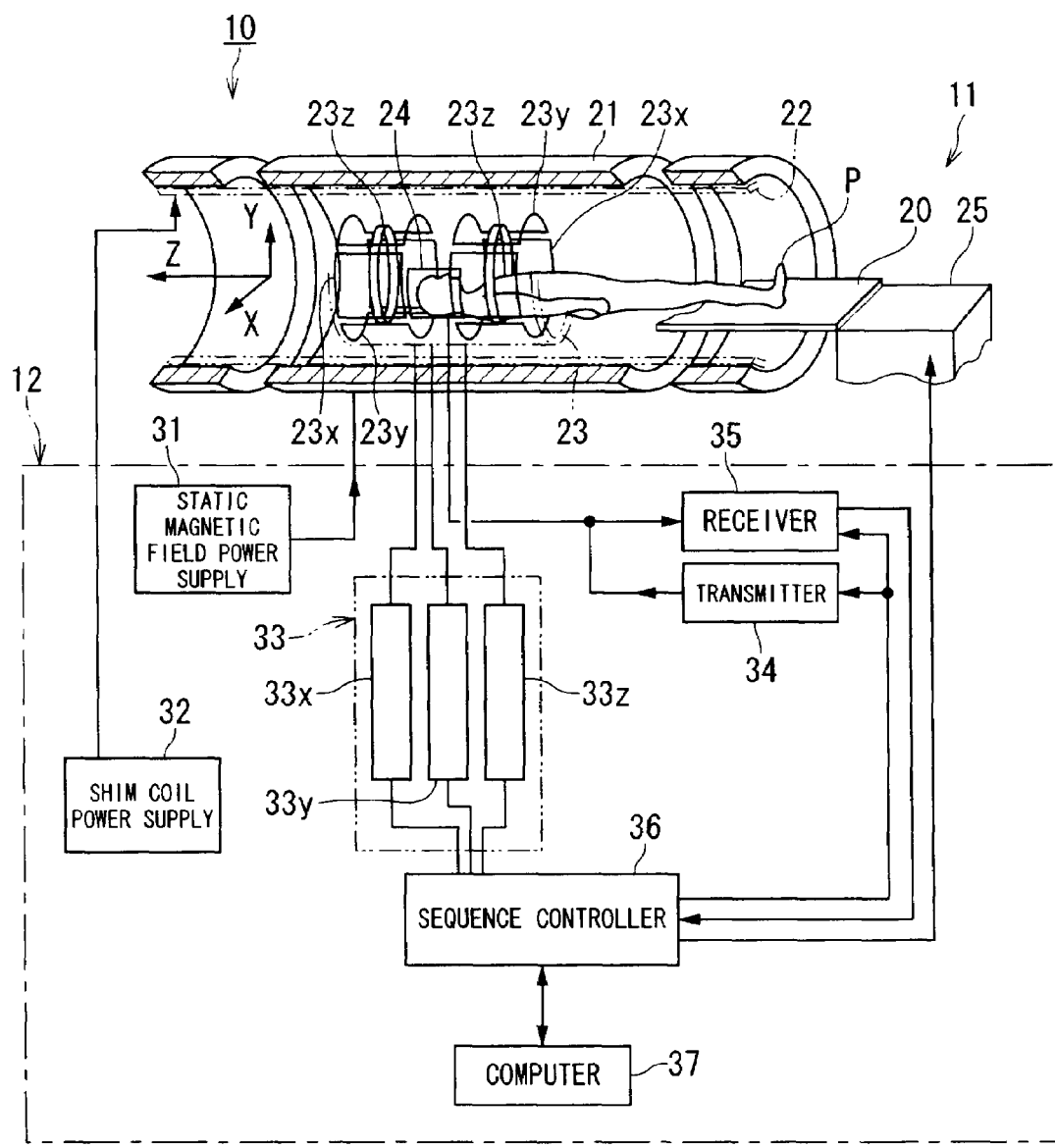
FIG. 1 is a schematic view illustrating the embodiment of the magnetic resonance imaging apparatus according to the present invention.

FIG. 1 is a schematic view illustrating the embodiment of the magnetic resonance imaging apparatus according to the present invention.

FIG. 1 illustrates a magnetic resonance imaging (MRI) apparatus 10 according to the present embodiment. The MRI apparatus 10 images a patient (an object) P while continuously moving the patient P. The MRI apparatus 10 is mainly formed by an imaging system 11 and a controlling system 12.

The imaging system 11 of the MRI apparatus 10 includes, in a gantry (not illustrated), a table-top 20, a static field magnet 21, a shim coil 22, a gradient coil 23, a radio frequency (RF) coil 24, and a bed structure 25.

The table-top 20 is capable of placing thereon the patient P, and is advanced or retreated with respect to the gantry and in a bore formed inside the gantry.

The static field magnet 21 is formed into a cylindrical shape having an axis extending in an advance and retreat direction of the table-top 20 (a Z-axis direction).

The shim coil 22 is formed into a cylindrical shape having an axis extending in the Z-axis direction and provided inside the static field magnet 21. Note that the shim coil 22 may be formed integrally with the gradient coil 23.

The gradient coil 23 is formed into a cylindrical shape having an axis extending in the Z-axis direction and provided inside the shim coil 22. The gradient coil 23 is formed by an X-axis gradient coil 23x, a Y-axis gradient coil 23y, and a Z-axis gradient coil 23z. Note that description will be made of an example in which the gradient coil 23 is saddle-shaped in the present embodiment.

The RF coil 24 is formed by multiple coils. The RF coil 24 has a function of receiving a high-frequency signal from the controlling system 12 and transmitting a high-frequency magnetic field pulse to the patient P, and a function of receiving an NMR signal generated along with the excitation by the high-frequency signal of the nuclear spin inside the patient P and supplying the NMR signal to the controlling system 12. The transmission and reception system of the RF coil 24 is divided into a system using a single coil as a transmitter coil and a receiver coil and a system using separate coils as the transmitter coil and the receiver coil.

The bed structure 25 has a function of controlling the advance and retreat of the table-top 20 capable of placing thereon the patient P.

Meanwhile, the controlling system 12 of the MRI apparatus 10 is provided with a static magnetic field power supply 31, a shim coil power supply 32, a gradient magnetic field power supply 33, a transmitter 34, a receiver 35, a sequence controller (a sequencer) 36, and a computer 37.

The static magnetic field power supply 31 is connected to the static field magnet 21 to form a static magnetic field in a field of view (FOV) via the static field magnet 21.

The shim coil power supply 32 is connected to the shim coil 22 to homogenize, via the shim coil 22, the static magnetic field formed by the static field magnet 21.

Further, the gradient coil 23 is connected to the gradient magnetic field power supply 33. The X-axis gradient coil 23x, the Y-axis gradient coil 23y, and the Z-axis gradient coil 23z of the gradient coil unit 23 are connected to an X-axis gradient magnetic field power supply 33x, a Y-axis gradient magnetic field power supply 33y, and a Z-axis gradient magnetic field power supply 33z of the gradient magnetic field power supply 33, respectively.

Current is supplied from the X-axis gradient magnetic field power supply 33x, the Y-axis gradient magnetic field power supply 33y, and the Z-axis gradient magnetic field power supply 33z to the X-axis gradient coil 23x, the Y-axis gradient coil 23y, and the Z-axis gradient coil 23z, respectively. Thereby, the current generates in the FOV a gradient magnetic field Gx in the X-axis direction, a gradient magnetic field Gy in the Y-axis direction, and a gradient magnetic field Gz in the Z-axis direction, respectively.

The sequence controller 36 is connected to the bed structure 25, the gradient magnetic field power supply 33, the transmitter 34, and the receiver 35. The sequence controller 36 includes at least a central processing unit (CPU) and a memory, which are not illustrated. The sequence controller 36 stores the control information required to drive the bed structure 25, the gradient magnetic field power supply 33, the transmitter 34, and the receiver 35, such as the sequence information describing the operation control information including the intensity, the application time, and the application timing of pulse current which should be applied to the gradient magnetic field power supply 33, for example.

Further, in accordance with a predetermined sequence stored in the sequence controller 36, the sequence controller 36 drives the bed structure 25 to advance or retreat the table-top 20 in the Z-axis direction with respect to the gantry. Further, in accordance with the stored predetermined sequence, the sequence controller 36 drives the gradient magnetic field power supply 33, the transmitter 34, and the receiver 35 to generate the X-axis gradient magnetic field Gx, the Y-axis gradient magnetic field Gy, the Z-axis gradient magnetic field Gz, and an RF signal in the gantry.

On the basis of the control information received from the sequence controller 36, the transmitter 34 supplies the RF signal to the RF coil 24. Meanwhile, the receiver 35 performs required signal processing on the NMR signal received from the RF coil 24, and performs A/D (analog to digital) conversion on the signal to generate raw data, i.e., the NMR signal digitized through the receiver 35. Further, the receiver 35 supplies the generated raw data to the sequence controller 36. Upon receipt of the raw data from the receiver 35, the sequence controller 36 supplies the data to the computer 37.

The computer 37 of the controlling system 12 is formed by basic hardware, such as a CPU, a memory, a hard disk (HD), an interface (IF), an input device, and a display device, which are not illustrated.

Figure 2:
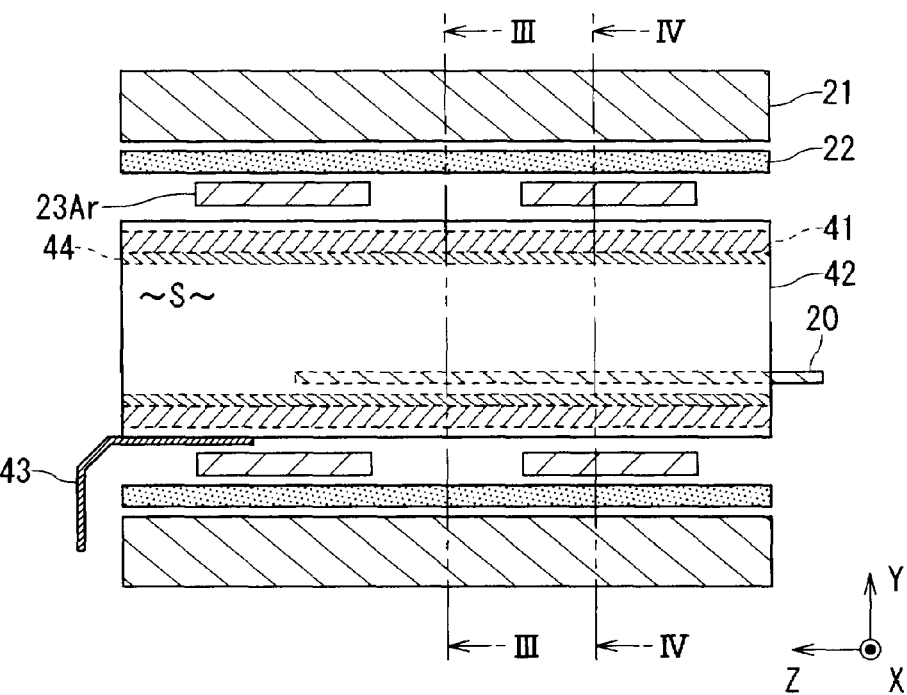
FIG. 2 is a side view illustrating the first example of the structure of the imaging system.
Figure 3:
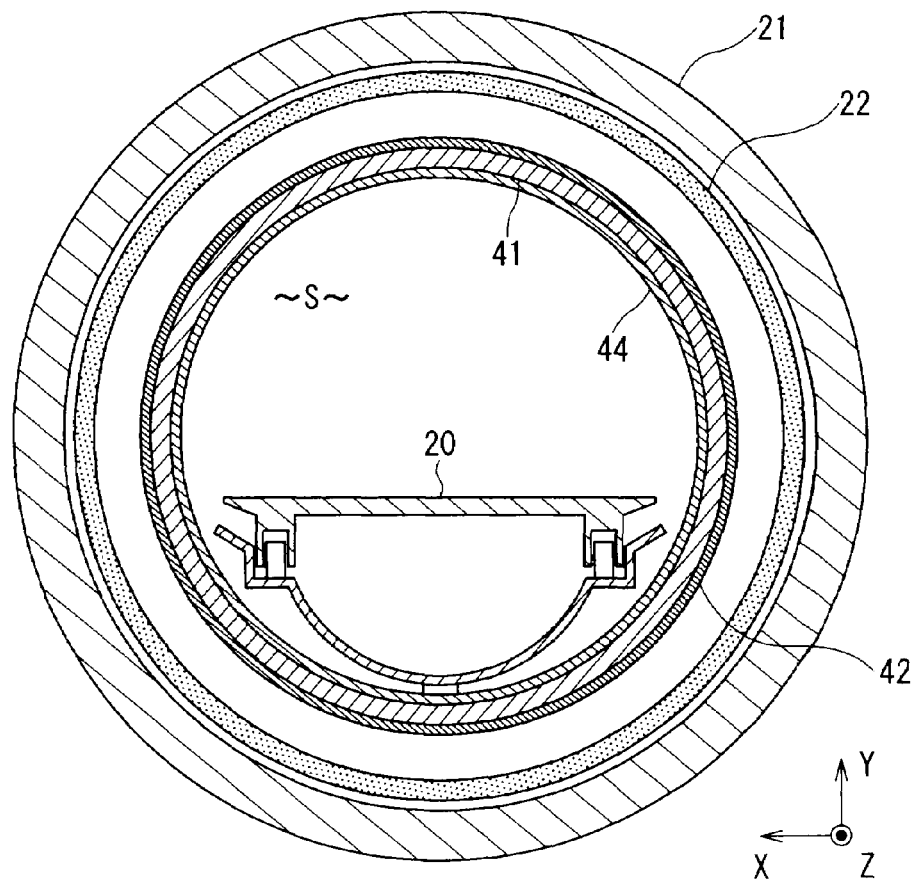
FIG. 3 is a cross-sectional view along the III-III line illustrating the first example of the structure of the imaging system illustrated in FIG. 2.
Figure 4:
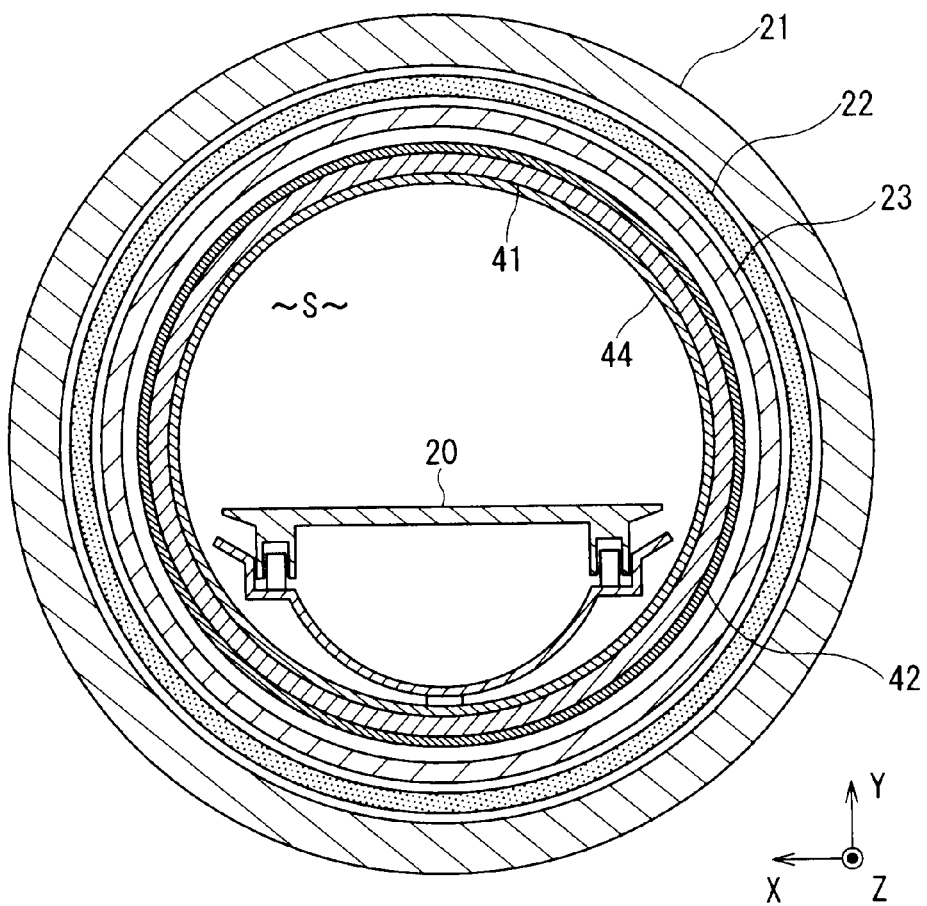
FIG. 4 is a cross-sectional view along the IV-IV line illustrating the first example of the structure of the imaging system illustrated in FIG. 2.

FIGS. 2, 3, and 4 are diagrams illustrating a first example of the structure of the imaging system 11 forming the MRI apparatus 10 of the present embodiment. FIG. 2 is a side view illustrating the first example of the structure of the imaging system 11. FIG. 3 is a cross-sectional view along the III-III line illustrating the first example of the structure of the imaging system 11 illustrated in FIG. 2. FIG. 4 is a cross-sectional view along the IV-IV line illustrating the first example of the structure of the imaging system 11 illustrated in FIG. 2.

As illustrated in FIGS. 2, 3, and 4, the imaging system 11 of the MRI apparatus 10 includes a cylindrical liner 41 having an axis extending in the Z-axis direction and provided inside the gradient coil 23 to form a bore S in which the table-top 20 is advanced or retreated. In an imaging process, heat is generated by the X-axis gradient coil 23x, the Y-axis gradient coil 23y, and the Z-axis gradient coil 23z of the gradient coil unit 23, respectively. Due to the heat conduction and radiation of the heat, a difference in temperature according to the density of the coils is caused in the liner 41.

Figure 5:
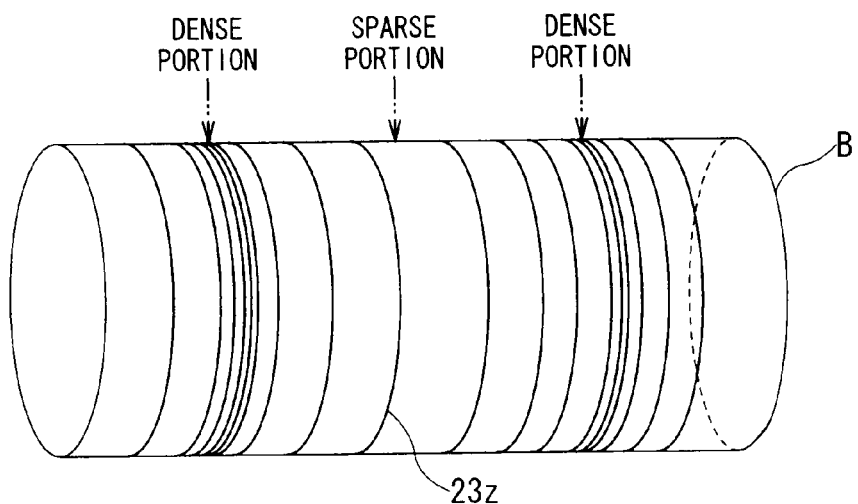
FIG. 5 is a perspective view illustrating an example of the coil pattern of the gradient coil, e.g., the Z-axis gradient coil.

FIG. 5 is a perspective view illustrating an example of the coil pattern of the gradient coil 23, e.g., the Z-axis gradient coil 23z.

As illustrated in FIG. 5, the Z-axis gradient coil 23z wound around a bobbin B includes dense portions and sparse portions. The dense portions and the sparse portions of the Z-axis gradient coil 23z vary depending on the coil pattern of the Z-axis gradient coil 23z. The following description, which will be made of the Z-axis gradient coil 23z, also applies to the X-axis gradient coil 23x and the Y-axis gradient coil 23y.

In view of the above, as illustrated in FIGS. 2, 3, and 4, the imaging system 11 of the MRI apparatus 10 includes a heat transfer material 42 attached to the liner 41 to disperse the heat of portions of the liner 41 corresponding to the dense portions 23Ar of the Z-axis gradient coil 23z. If there is a difference in temperature in the heat transfer material 42, heat transfer occurs from high-temperature portions of the heat transfer material 42 (portions of the heat transfer material 42 corresponding to the portions 23Ar) to low-temperature portions of the heat transfer material 42 (portions of the heat transfer material 42 corresponding to the sparse portions of the Z-axis gradient coil 23z). Herein, it is desirable that the heat transfer material 42 has a higher thermal conductivity in the width direction thereof than in the thickness direction thereof, or that the heat transfer material 42 has a higher thermal conductivity in the surface direction thereof than in the thickness direction thereof. For example, Dyneema (a trademark) FRP (fiber reinforced plastic) can be used as the heat transfer material 42. Further, the heat transfer material 42 may be pasted to the liner 41 as a heat transfer sheet.

Further, as illustrated in FIGS. 2, 3, and 4, the heat transfer material 42 is attached to an outer circumferential surface of the liner 41 in the MRI apparatus 10. When the outer circumferential surface of the liner 41 is compared with an inner circumferential surface thereof, the tendency to have a high temperature due to the heat generated by the gradient coil 23 is greater on the outer circumferential surface of the liner 41. To effectively disperse the heat of the high-temperature portions of the liner 41, therefore, it is desirable to attach the heat transfer material 42 to at least the outer circumferential surface of the liner 41. Alternatively, the heat transfer material 42 may also be attached to the inner circumferential surface as well as the outer circumferential surface of the liner 41.

Herein, depending on the coil pattern of the Z-axis gradient coil 23z, the coil includes phases from the dense portions to the sparse portions. Accordingly, the phases from the dense portions to the sparse portions of the coil may be divided into a plurality of (two or more) portions, and at least one of the number of layers and the thermal conductivity of the attached heat transfer material 42 may be changed in a phased manner for each of portions of the liner 41 corresponding to the respective divided portions.

Further, as illustrated in FIG. 2, a heat radiation material (a fin) 43 extending outside the bore S may be attached to a portion of the heat transfer material 42 attached to the outer circumferential surface of the liner 41. If the heat radiation material 43 is attached to a portion of the heat transfer material 42, the heat of the heat transfer material 42 is radiated into the air outside the bore S through the heat radiation material 43.

Further, as illustrated in FIGS. 2, 3, and 4, it is preferred that a heat shield material 44 is attached to the entire inner circumferential surface of the liner 41. Alternatively, although not illustrated, it is preferred that the heat shield material 44 is attached only to a portion in contact with the patient P (an entire upper portion above an uppermost surface of the table-top 20) of the inner circumferential surface of the liner 41. The attachment of the heat shield material 44 increases the effect of preventing the patient P from suffering a low-temperature burn.

According to the first example of the structure of the imaging system 11, the heat of the portions of the liner 41 near the portions 23Ar and locally having a high temperature is effectively conducted all over the liner 41. Accordingly, it is possible to prevent the patient P from feeling discomfort or suffering a low-temperature burn when he comes in contact with the portions of the liner 41 locally having a high temperature.

Figure 6:
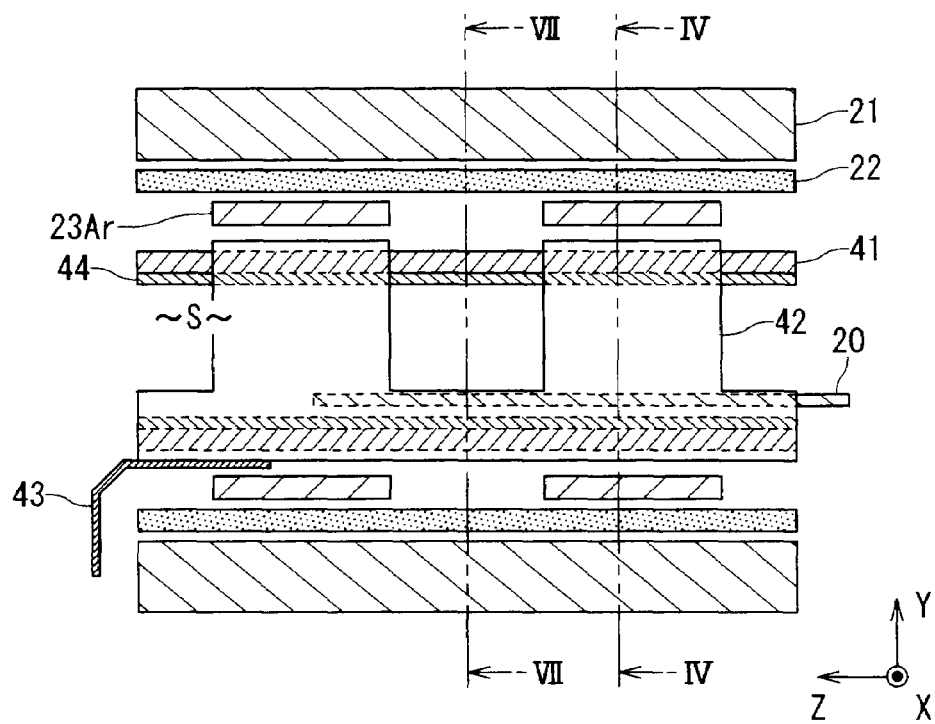
FIG. 6 is a side view illustrating the second example of the structure of the imaging system.
Figure 7:
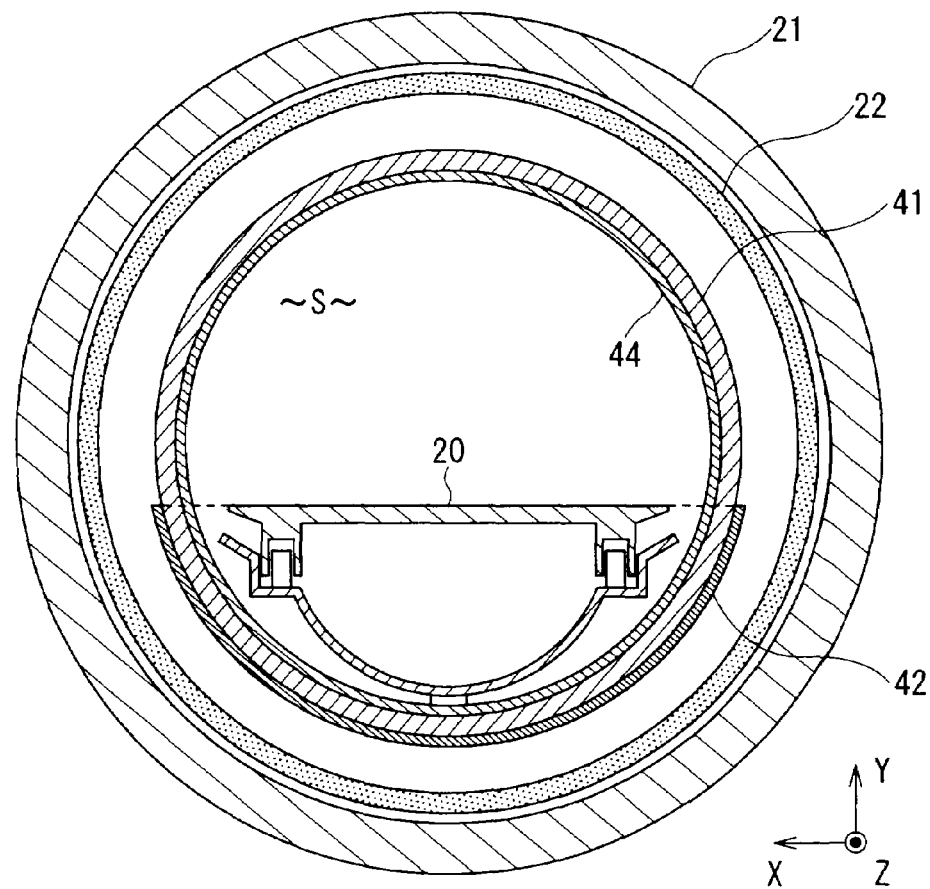
FIG. 7 is a cross-sectional view along the VII-VII line illustrating the second example of the structure of the imaging system 11 illustrated in FIG. 6.

FIGS. 6 and 7 are diagrams illustrating a second example of the structure of the imaging system 11 forming the MRI apparatus 10 of the present embodiment. FIG. 6 is a side view illustrating the second example of the structure of the imaging system 11. FIG. 7 is a cross-sectional view along the VII-VII line illustrating the second example of the structure of the imaging system 11 illustrated in FIG. 6. Note that a cross-sectional view along the IV-IV line illustrating the second example of the structure of the imaging system 11 illustrated in FIG. 6 is similar to the cross-sectional view along the IV-IV line illustrated in FIG. 4.

As illustrated in FIGS. 4, 6, and 7, the imaging system 11 of the MRI apparatus 10 includes the cylindrical liner 41 having an axis extending in the Z-axis direction and provided inside the gradient coil 23 to form the bore S in which the table-top 20 is advanced or retreated. In the imaging process, heat is generated by the X-axis gradient coil 23x, the Y-axis gradient coil 23y, and the Z-axis gradient coil 23z of the gradient coil unit 23, respectively. Due to the heat conduction and radiation of the heat, a difference in temperature according to the density of the coils is caused in the liner 41.

As compared with the first example of the structure of the imaging system 11, in the second example of the structure of the imaging system 11 illustrated in FIGS. 4, 6, and 7, the heat transfer material 42 is attached such that the heat generated by the Z-axis gradient coil 23z is effectively conducted to a portion not in contact with the patient P. That is, the heat transfer material 42 is attached to portions of the entire liner 41 corresponding to the dense portions 23Ar of the Z-axis gradient coil 23z, and to an entire lower portion of the entire liner 41 below the uppermost surface of the table-top 20. If there is a difference in temperature in the heat transfer material 42, heat transfer occurs from the high-temperature portions of the heat transfer material 42 (the portions of the heat transfer material 42 corresponding to the portions 23Ar) to a low-temperature portion of the heat transfer material 42 (an entire lower portion of the heat transfer material 42 below the uppermost surface of the table-top 20). The heat transfer material 42 may also be attached to the inner circumferential surface as well as the outer circumferential surface of the liner 41.

Herein, depending on the coil pattern of the Z-axis gradient coil 23z, the coil includes phases from the dense portions to the sparse portions. Accordingly, the phases from the dense portions to the sparse portions of the coil may be divided into a plurality of portions, and at least one of the number of layers and the thermal conductivity of the attached heat transfer material 42 may be changed in a phased manner for each of portions of the liner 41 corresponding to the respective divided portions.

Further, when the X-axis gradient coil 23x, the Y-axis gradient coil 23y, and the Z-axis gradient coil 23z are taken into consideration as the gradient coil 23, the dense portions and the sparse portions of the coils are determined by the combination of the respective coils. In such a case, the heat transfer material 42 is attached to portions of the entire outer circumferential surface of the liner 41 corresponding to the dense portions of the X-axis gradient coil 23x, the Y-axis gradient coil 23y, and the Z-axis gradient coil 23z, and to the entire lower portion of the entire outer circumferential surface of the liner 41 below the uppermost surface of the table-top 20.

Further, as illustrated in FIG. 6, the heat radiation material 43 extending outside the bore S may be attached to a portion of the heat transfer material 42 attached to the outer circumferential surface of the liner 41. If the heat radiation material 43 is attached to a lower portion of the heat transfer material 42 as a portion of the heat transfer material 42, the heat conducted to the entire lower portion of the heat transfer material 42 below the uppermost surface of the table-top 20 is radiated into the air outside the bore S through the heat radiation material 43.

Further, as illustrated in FIGS. 4, 6, and 7, it is preferred that the heat shield material 44 is attached to the entire inner circumferential surface of the liner 41. Alternatively, although not illustrated, it is preferred that the heat shield material 44 is attached only to the portion in contact with the patient P (the entire upper portion above the uppermost surface of the table-top 20) of the inner circumferential surface of the liner 41. The attachment of the heat shield material 44 increases the effect of preventing the patient P from suffering a low-temperature burn.

According to the second example of the structure of the imaging system 11, the heat of the portions of the liner 41 near the portions 23Ar and locally having a high temperature is effectively conducted only to the portion not in contact with the patient P. Accordingly, it is possible to prevent the patient P from feeling discomfort or suffering a low-temperature burn when he comes in contact with the portions of the liner 41 locally having a high temperature.

Figure 8:
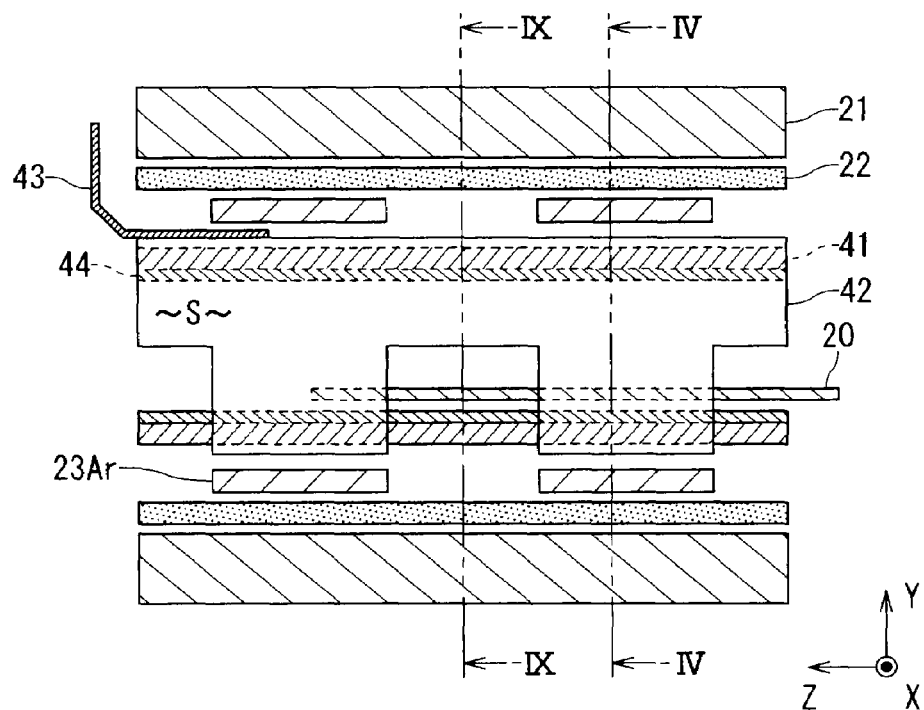
FIG. 8 is a side view illustrating the third example of the structure of the imaging system.
Figure 9:
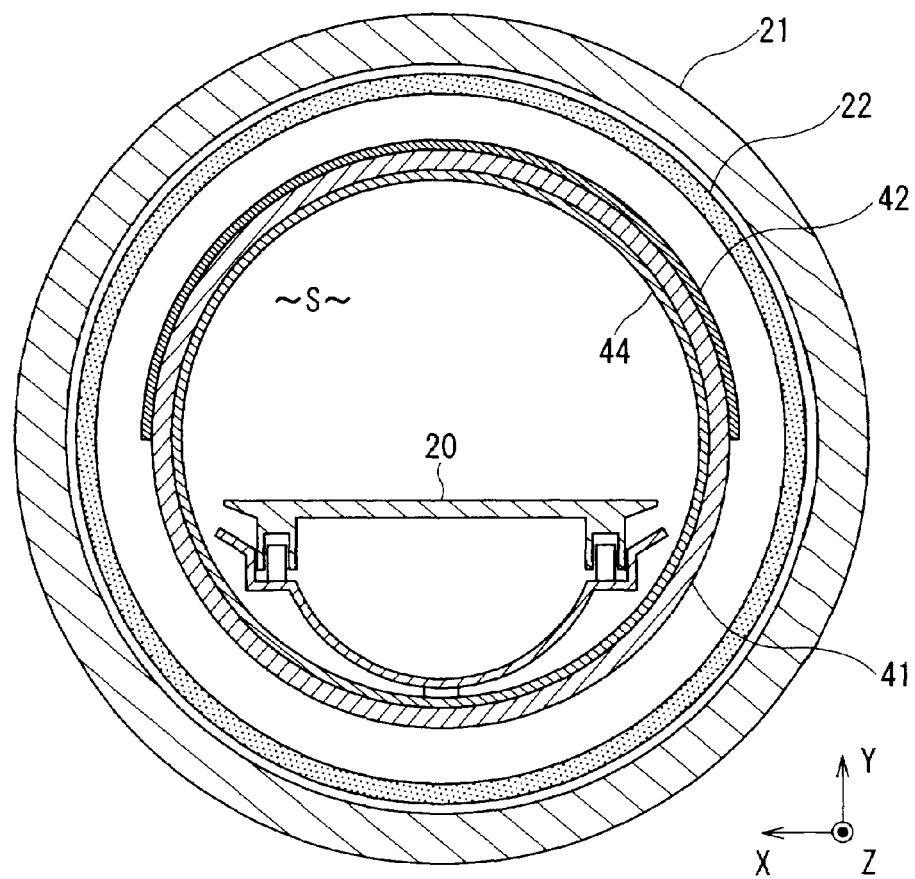
FIG. 9 is a cross-sectional view along the IX-IX line illustrating the third example of the structure of the imaging system 11 illustrated in FIG. 8.

FIGS. 8 and 9 are diagrams illustrating a third example of the structure of the imaging system 11 forming the MRI apparatus 10 of the present embodiment. FIG. 8 is a side view illustrating the third example of the structure of the imaging system 11. FIG. 9 is a cross-sectional view along the IX-IX line illustrating the third example of the structure of the imaging system 11 illustrated in FIG. 8. Note that a cross-sectional view along the IV-IV line illustrating the third example of the structure of the imaging system 11 illustrated in FIG. 8 is similar to the cross-sectional view along the IV-IV line illustrated in FIG. 4.

As illustrated in FIGS. 4, 8, and 9, the imaging system 11 of the MRI apparatus 10 includes the cylindrical liner 41 having an axis extending in the Z-axis direction and provided inside the gradient coil 23 to form the bore S in which the table-top 20 is advanced or retreated. In the imaging process, heat is generated by the X-axis gradient coil 23x, the Y-axis gradient coil 23y, and the Z-axis gradient coil 23z of the gradient coil unit 23, respectively. Due to the heat conduction and radiation of the heat, a difference in temperature according to the density of the coils is caused in the liner 41.

As compared with the first example of the structure of the imaging system 11, in the third example of the structure of the imaging system 11 illustrated in FIGS. 4, 8, and 9, the heat transfer material 42 is attached such that the heat generated by the gradient coil 23 is effectively conducted to un upper layer. That is, the heat transfer material 42 is attached to the portions of the entire liner 41 corresponding to the dense portions 23Ar of the Z-axis gradient coil 23z, and to an entire upper portion of the entire liner 41 not including at least the entire lower portion of the liner 41 below the uppermost surface of the table-top 20. If there is a difference in temperature in the heat transfer material 42, heat transfer occurs from the high-temperature portions of the heat transfer material 42 (the portions of the heat transfer material 42 corresponding to the portions 23Ar) to a low-temperature portion of the heat transfer material 42 (an entire upper portion of the heat transfer material 42). The heat transfer material 42 may also be attached to the inner circumferential surface as well as the outer circumferential surface of the liner 41.

Herein, depending on the coil pattern of the Z-axis gradient coil 23z, the coil includes phases from the dense portions to the sparse portions. Accordingly, the phases from the dense portions to the sparse portions of the coil may be divided into a plurality of portions, and at least one of the number of layers and the thermal conductivity of the attached heat transfer material 42 may be changed in a phased manner for each of portions of the liner 41 corresponding to the respective divided portions.

Further, when the X-axis gradient coil 23x, the Y-axis gradient coil 23y, and the Z-axis gradient coil 23z are taken into consideration as the gradient coil 23, the dense portions and the sparse portions of the coils are determined by the combination of the respective coils. In such a case, the heat transfer material 42 is attached to the portions of the entire outer circumferential surface of the liner 41 corresponding to the dense portions of the X-axis gradient coil 23x, the Y-axis gradient coil 23y, and the Z-axis gradient coil 23z, and to the entire upper portion of the entire outer circumferential surface of the liner 41 above the uppermost surface of the table-top 20.

Further, as illustrated in FIG. 8, the heat radiation material 43 extending outside the bore S may be attached to a portion of the heat transfer material 42 attached to the outer circumferential surface of the liner 41. If the heat radiation material 43 is attached to an upper portion of the heat transfer material 42 as a portion of the heat transfer material 42, the heat of the entire upper portion of the heat transfer material 42 is radiated into the air outside the bore S through the heat radiation material 43.

Further, as illustrated in FIGS. 4, 8, and 9, it is preferred that the heat shield material 44 is attached to the entire inner circumferential surface of the liner 41. Alternatively, although not illustrated, it is preferred that the heat shield material 44 is attached only to the portion in contact with the patient P (the entire upper portion above the uppermost surface of the table-top 20) of the inner circumferential surface of the liner 41. The attachment of the heat shield material 44 increases the effect of preventing the patient P from suffering a low-temperature burn.

According to the third example of the structure of the imaging system 11, the heat of the portions of the liner 41 near the portions 23Ar and locally having a high temperature is effectively conducted only to the portion not in contact with the patient P. Accordingly, it is possible to prevent the patient P from feeling discomfort or suffering a low-temperature burn when he comes in contact with the portions of the liner 41 locally having a high temperature.

The MRI apparatus 10 of the present embodiment can provide an optimal imaging environment for the patient P.

In the present embodiment, the tunnel-shaped MRI apparatus 10 having the cylindrical bore S has been described as the MRI apparatus according to the present invention. However, the MRI apparatus according to the present invention is not limited to the tunnel-shaped MRI apparatus 10, but may be an open-type MRI apparatus.

What is claimed is:

1. A magnetic resonance imaging apparatus comprising:
   a bed including a table-top capable of placing thereon an object;
   a static field magnet configured to generate a static magnetic field;
   a gradient coil, formed inside the static field magnet, configured to generate gradient magnetic fields;
   a liner, provided inside the gradient coil, configured to form a bore in which the table-top is advanced or retreated; and
   a heat transfer material, attached to the liner, as a heat transfer sheet that is able to be pasted to the liner.

2. The magnetic resonance imaging apparatus according to claim 1,
   wherein at least one of a number of layers and a thermal conductivity of the heat transfer material attached to the liner is changed in a phased manner.

3. The magnetic resonance imaging apparatus according to claim 1,
   wherein the heat transfer material is attached to at least an outer circumferential surface of the liner.

4. The magnetic resonance imaging apparatus according to claim 3,
   wherein the heat transfer material is uniformly attached to entire outer circumferential surface of the liner.

5. The magnetic resonance imaging apparatus according to claim 3,
   wherein the heat transfer material is attached to portions of an entire outer circumferential surface of the liner corresponding to a dense portion of the gradient coil, and to an entire lower portion of the entire outer circumferential surface of the liner below an uppermost surface of the table-top.

6. The magnetic resonance imaging apparatus according to claim 5,
   wherein the heat transfer material is attached to portions of the entire outer circumferential surface of the liner corresponding to dense portions of an X-axis gradient coil, a Y-axis gradient coil, and a Z-axis gradient coil, which form the gradient coil, and to the entire lower portion.

7. The magnetic resonance imaging apparatus according to claim 3,
   wherein the heat transfer material is attached to portions of the entire outer circumferential surface of the liner corresponding to a dense portion of the gradient coil, and to an entire upper portion of the entire outer circumferential surface of the liner not including an entire lower portion of the entire outer circumferential surface of the liner below an uppermost surface of the table-top.

8. The magnetic resonance imaging apparatus according to claim 7,
   wherein the heat transfer material is attached to portions of the entire outer circumferential surface of the liner corresponding to dense portions of an X-axis gradient coil, a Y-axis gradient coil, and a Z-axis gradient coil, which form the gradient coil, and to the entire upper portion.

9. The magnetic resonance imaging apparatus according to claim 1, further comprising:
   a heat shield material attached to an entire inner circumferential surface of the liner.

10. A magnetic resonance imaging apparatus comprising:
    a bed including a table-top capable of placing thereon an object;
    a static field magnet configured to generate a static magnetic field;
    a gradient coil, formed inside the static field magnet, configured to generate gradient magnetic fields;
    a liner, provided inside the gradient coil, configured to form a bore in which the table-top is advanced or retreated;
    a heat transfer material, attached to the liner; and
    a heat shield material attached to an entire upper portion of an inner circumferential surface of the liner above an uppermost surface of the table-top.

11. A magnetic resonance imaging apparatus comprising:
    a bed including a table-top capable of placing thereon an object;
    a static field magnet configured to generate a static magnetic field;
    a gradient coil, formed inside the static field magnet, configured to generate gradient magnetic fields:
    a liner, provided inside the gradient coil, configured to form a bore in which the table-top is advanced or retreated;
    a heat transfer material, attached to the liner; and
    a heat radiation material, attached to a portion of the heat transfer material, extending outside the bore.

12. A magnetic resonance imaging apparatus comprising:
    a bed including a table-top capable of placing thereon an object;
    a static field magnet configured to generate a static magnetic field;
    a gradient coil, formed inside the static field magnet, configured to generate gradient magnetic fields;
    a liner, provided inside the gradient coil, configured to form a bore in which the table- top is advanced or retreated; and
    a heat transfer material, attached to the liner, having a higher thermal conductivity in the width direction thereof than in the thickness direction thereof.

13. A magnetic resonance imaging apparatus comprising:
    a bed including a table-top capable of placing thereon an object;
    a static field magnet configured to generate a static magnetic field;
    a gradient coil, formed inside the static field magnet, configured to generate gradient magnetic fields;
    a liner, provided inside the gradient coil, configured to form a bore in which the table-top is advanced or retreated; and
    a heat transfer material, attached to the liner, having a higher thermal conductivity in the surface direction thereof than in the thickness direction thereof.

* * * * *